(12) United States Patent
Deng

(10) Patent No.: US 6,552,566 B2
(45) Date of Patent: Apr. 22, 2003

(54) LOGIC ARRAY CIRCUITS USING SILICON-ON-INSULATOR LOGIC

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/933,686

(22) Filed: Aug. 20, 2001

(65) Prior Publication Data

US 2002/0024358 A1 Feb. 28, 2002

Related U.S. Application Data

(60) Provisional application No. 60/226,828, filed on Aug. 22, 2000.

(51) Int. Cl.$^7$ .................................................. G06F 7/38
(52) U.S. Cl. ............................... 326/44; 326/45; 326/49; 326/50; 326/106
(58) Field of Search ............................... 326/39, 44, 49, 326/50, 106–108

(56) References Cited

U.S. PATENT DOCUMENTS

| 5,991,225 A | * | 11/1999 | Forbes et al. | .......... 365/230.06 |
| 6,222,788 B1 | * | 4/2001 | Forbes et al. | .......... 365/230.06 |
| 6,229,342 B1 | * | 5/2001 | Noble et al. | ................ 326/102 |

* cited by examiner

*Primary Examiner*—Michael Tokar
*Assistant Examiner*—Anh Tran
(74) *Attorney, Agent, or Firm*—Peter K. McLarty; W. James Brady, III; Frederick J. Telecky, Jr.

(57) ABSTRACT

Logic array circuits are formed on SOI substrates. The pull-down network (130) of the logic array circuit comprises NMOS transistors (125) and PMOS transistors (120) configured in series.

14 Claims, 2 Drawing Sheets

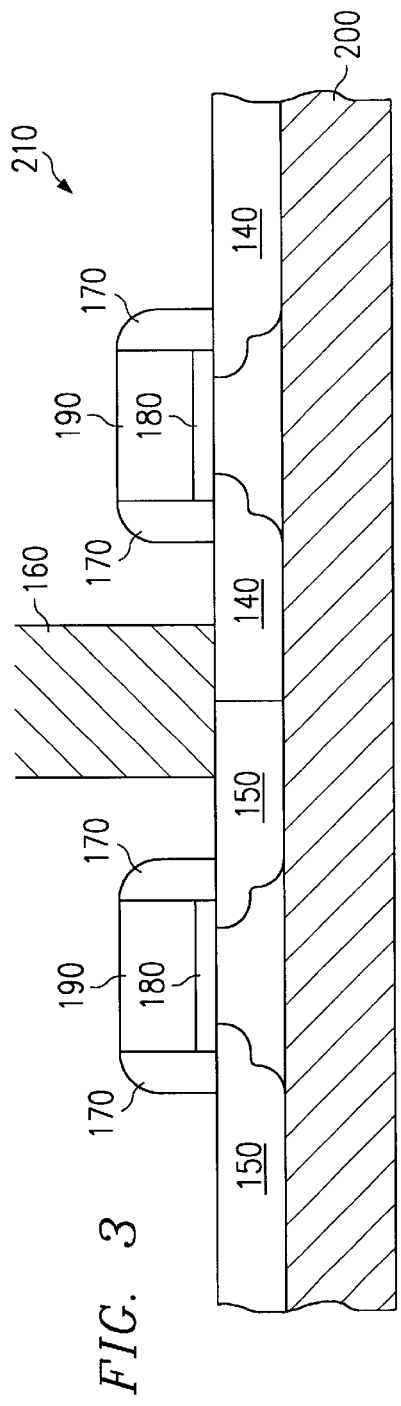
FIG. 3
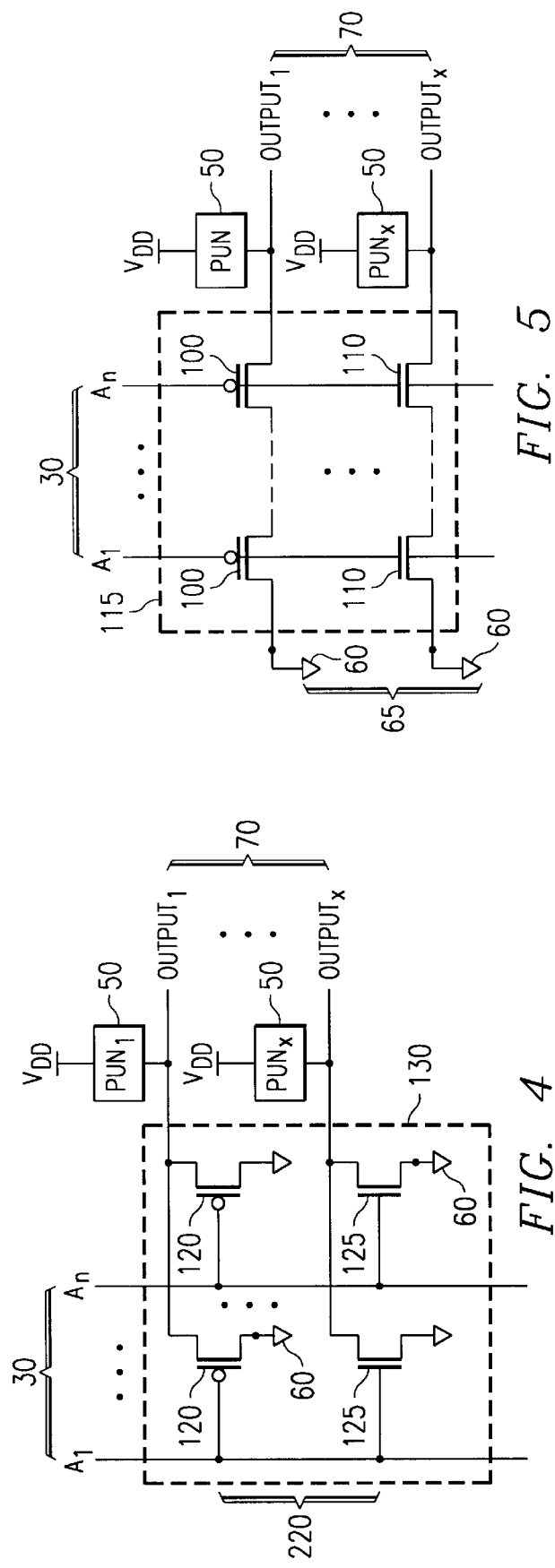
FIG. 4
FIG. 5

LOGIC ARRAY CIRCUITS USING SILICON-ON-INSULATOR LOGIC

This application claims priority under 35 USC §119(e)(1) of provisional application Ser. No. 60/226,828, filed Aug. 22, 2000.

FIELD OF THE INVENTION

The invention is generally related to the field of logic circuits and more specifically to a novel design methodology for achieving faster circuits with a more compact circuit layout.

BACKGROUND OF THE INVENTION

Designing small, fast, low-power, and reliable logic circuits is becoming more difficult with scaling. Integrated logic circuits on silicon on insulator (SOI) substrates are beginning to find increasing usage in an effort to achieve these goals. SOI refers to a silicon substrate where the top layer (in which the devices are fabricated) is separated from the "bulk" portion of the substrate by a insulator layer. This can be contrasted with bulk silicon substrates which have no buried insulator layer. In bulk CMOS circuits, NMOS transistors are fabricated in p-type wells and PMOS devices are formed in n-type wells with both well structures formed in the substrate. These well structures provide the electrical isolation required between the NMOS and PMOS transistors in CMOS logic circuits. The spacing requirement of these well structures for proper electrical isolation in bulk CMOS logic circuit fabrication has led to grouping of NMOS and PMOS transistors to maximize circuit density. In bulk CMOS circuits, basic transistor networks performing logic functions can be classified as the following three types: pull-up network (PUN), which conditionally forms a current path between the output node and the circuit power supply, pull-down network (PDN), which conditionally forms a current path between the output node and the circuit ground, and pass-transistor network (PTN), which conditionally forms a current path between the output node and the pass inputs. In general only PMOS transistors are used in a PUN, only NMOS transistors are used in a PDN, and only PMOS or only NMOS transistors are used in a PTN except for pass gate logic. In early NMOS logic circuits, both enhancement and depletion mode NMOS transistors were used as pull up devices. In these NMOS circuits however, the gate of the enhancement transistor was connected to a fixed voltage (usually the supply voltage) and the gate of the depletion transistor was connected to the output node.

In general, digital circuits can be divided into two groups, static and dynamic circuits. Dynamic circuits can be further subdivided into one-phase "domino" circuits, two-phase ratioed, and ratioless circuits. Ratioless dynamic circuits can be further divided into two-phase and four-phase circuits. Logic networks generally comprise combinational and sequential networks. Combinational networks comprise gates and programmable logic arrays, and sequential networks comprise latches, registers, counters, and read-write memory. Combinational logic networks operate without the need of any periodic clock signals. However all but the very smallest digital systems require sequential as well as combinational logic. As a practical matter, all systems employing sequential logic require the use of periodic clock signals for correctly synchronized operation. In static SOI logic circuits, combinational or sequential, clock signals are introduced only at normal gate inputs, identical to those used for logic inputs. In applications where circuit delay is important and where silicon area is at a premium, CMOS dynamic logic circuits are used. Dynamic gates require clock signals that perform a precharge function to reduce circuit delay.

Another class of logic circuits is array logic. Array logic refers broadly to the address decoders of memories, the programmable logic arrays, the programmable array logic, and the content addressable memories. Shown in FIG. 1 is block diagram of a typical logic array circuit. In an array logic circuit the output signals 70, $output_1$ to $output_x$ are functions of the input signals $A_1$ to $A_n$ 30 with the functionality defined by the interconnection in the pull-down network 10. The address input lines 30 are fed into an address predecoder 20. This address predecoder 20 produces a number of address inputs 40 that are fed into the pull-down network (PDN) 10. Typically, these address inputs 40 are fed to the gates of the MOS transistors that comprise the PDN 10. The PDN 10 is also typically connected to the circuit ground. The PDN 10 provides a number of output lines that are connected to a number of pull-up networks (PUN) 50 resulting in a number of array output lines 70.

Conventional SOI logic circuits are based on bulk CMOS logic with conventional SOI circuits and bulk CMOS circuits sharing the same circuit topology. This is the case for the static, dynamic, and array logic circuits and networks discussed above. Thus in conventional SOI logic circuits, only PMOS transistors are used in a PUN, only NMOS transistors are used in a PDN, and only PMOS or only NMOS transistors are used in a PTN except for complementary pass gate logic. This circuit layout and design methodology while optimized for bulk CMOS circuits does not take full advantage of the unique properties of SOI substrates. A new circuit design methodology is therefore required that fully utilizes the properties of SOI substrates for CMOS logic circuits.

SUMMARY OF THE INVENTION

The instant invention comprises array logic fabricated on SOI substrates. The unique nature of SOI substrates allows novel circuit configurations. In particular, an array logic circuit on a SOI substrate, comprising: a pull-down network comprising a plurality of rows wherein each row comprises a plurality of NMOS or PMOS transistors connected in parallel; a plurality of input address lines connected to the gates of said plurality of NMOS or PMOS transistors; a plurality of pull-up networks connected to said plurality of rows; and a plurality of output lines connected to common nodes of said pull-up networks and said plurality of rows. In addition, the pull-up network comprises a depletion mode NMOS transistor; the pull-up network comprises a precharge PMOS transistor with a clock input; and at least one of said MOS transistors in said pull-down network has a gate tied to a floating substrate body.

A further embodiment of the instant invention comprises; a pull-down network comprising a plurality of rows wherein each row comprises a plurality of NMOS or PMOS transistors connected in series; a plurality of input address lines connected to the gates of said plurality of NMOS or PMOS transistors; a plurality of pull-up networks connected to said plurality of rows; and a plurality of output lines connected to common nodes of said pull-up networks and said plurality of rows. In addition, the pull-up network comprises a depletion mode NMOS transistor; the pull-up network comprises a precharge PMOS transistor with a clock input; and at least one of said MOS transistors in said pull-down network has a gate tied to a floating substrate body.

BRIEF DESCRIPTION OF THE DRAWINGS

In the drawings:

FIG. 3 is a cross-section diagram showing CMOS transistors on an SOI substrate.

FIG. 4 is a SOI array logic circuit diagram showing an embodiment of the instant invention.

FIG. 5 is a SOI array logic circuit diagram showing a further embodiment of the instant invention.

Figure 1:
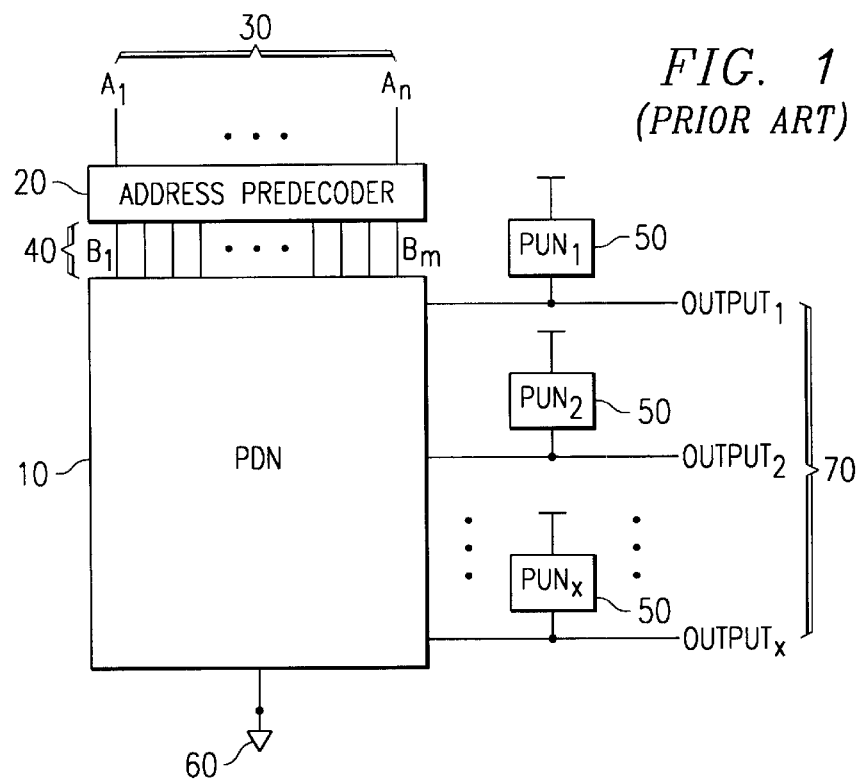
FIG. 1 is a block diagram showing a conventional CMOS array logic circuit.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1–5, the instant invention can be utilized in any semiconductor device structure. The methodology of the instant invention provides a design methodology for logic circuits.

Figure 2:
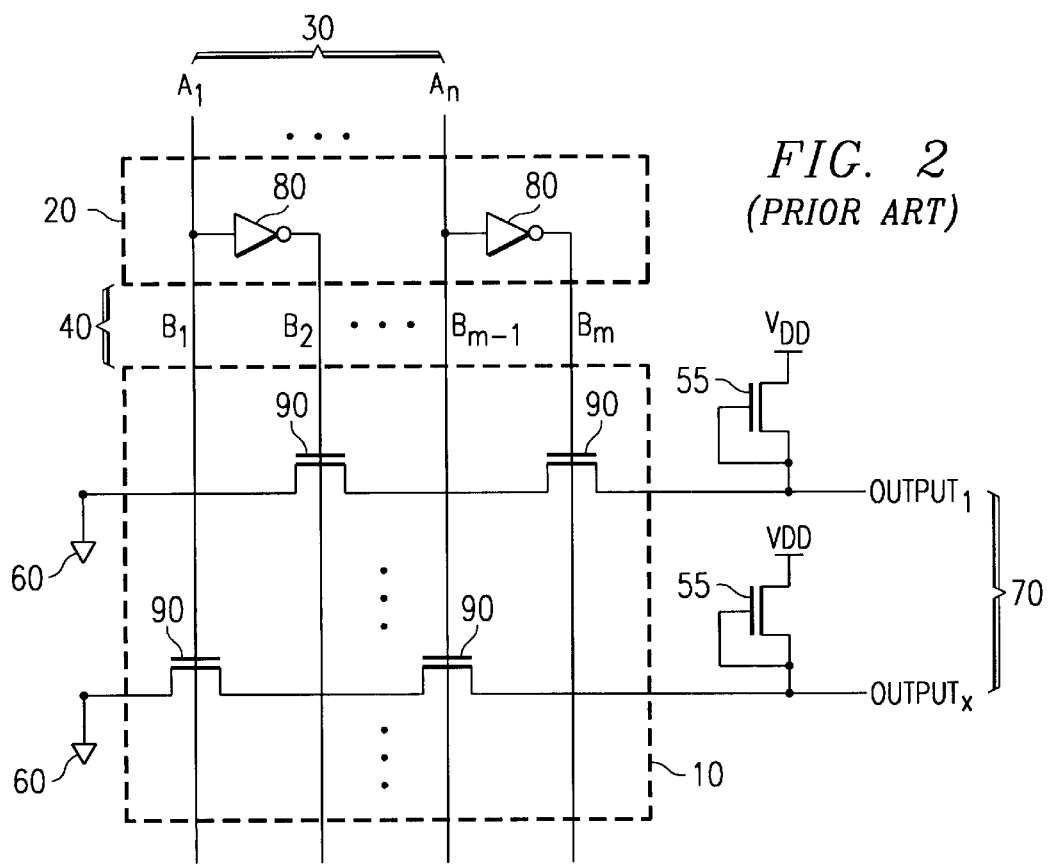
FIGS. 2 is a circuit diagram showing a conventional CMOS array logic circuit.

Shown in FIG. 2 is a typical bulk array logic network. The input address signals 30 is fed into an address predecoder circuit 20. This predecoder circuit 20 comprises a plurality of logic inverters 80 and outputs logic signals 40 that are fed into the PDN 10. The PDN comprises NMOS transistors 90 with the input logic signals being applied to the gates of the transistors 90. The NMOS transistors 90 are connected to a circuit ground 60 and to a plurality of pull-up networks (PUN). Here the PUN comprises a depletion mode NMOS transistor 55. Other schemes of possible PUN would comprise a precharge PMOS transistor with a clock input, an enhancement mode NMOS transistor, and a PMOS transistor. The output nodes of the array network 70 are connected to the common nodes of the PUN 55 and the PDN 10.

NMOS and PMOS transistors fabricated on SOI substrates is shown in FIG. 3. Using SOI substrates, the source/drain p-region 140 of a PMOS transistor can abut a source/drain n-region 150 of a NMOS transistor. In this scheme, the contact or silicide 160 that connects the p-region 140 and the n-region 150 can be optional in the "logic" sense if the p-n junction between the p-region 140 and the n-region 150 is never reversed biased. Unlike bulk CMOS technology, therefore, in SOI technology the physical connection of a PMOS transistor and an NMOS transistor along their source/drain regions consumes a silicon area that is compatible to the connection of two NMOS transistors or two PMOS transistors along their source/drain diffusions. Based on this unique property of SOI technology, a new logic for SOI termed here as "SOI logic" is defined in which both NMOS and PMOS transistors can be used in a basic transistor network. Specifically, NMOS transistors can be used in a PUN in addition to PMOS transistors and PMOS transistors can be used in a PDN in addition to NMOS transistors. In SOI logic, the gate terminals of the NMOS transistors in the PUN are not connected to a fixed voltage or the output terminal of the PUN. In addition to PUNs and PDNs, both NMOS and PMOS transistors can be used in a PTN. The buried dielectric layer 200 and the underlying substrate 210 are also illustrated in FIG. 3 along with the transistor gate dielectric 180, gate electrode 190, and sidewall structures 170.

SOI logic is a true superset of the bulk CMOS logic. In other words, any circuit topology in bulk CMOS logic also belongs to SOI logic; however, some circuit topologies in SOI logic do not belong to bulk CMOS logic. In addition to having low-power consumption and high reliability, it is important that SOI logic circuits consume minimum space on the wafer. In the design and layout of SOI logic circuits the following guidelines will aid in achieving minimum layout space. In a series connected transistor string in a basic transistor network, separately group the PMOS transistors and the NMOS transistors as much as possible to minimize the number of contacts or silicide areas that connect the p-regions of the PMOS transistors and the n-regions of the NMOS transistors. In a series connected transistor string in a PUN or a PDN, place all the PMOS transistors above the NMOS transistors, such that the contact or silicide connecting the PMOS and NMOS transistor source/drain regions is not needed, minimizing the layout area. In addition to layout area, circuit performance can be improved using low threshold voltage techniques such as electrically connecting the transistor gate to the floating body of the SOI transistor. The gate-to-body connection can be applied to the NMOS transistors and PMOS transistors in a PUN, the PMOS transistors and NMOS transistors in a PDN, and both the PMOS and NMOS transistors in a PTN. The gate-to-body connection utilizes the body effect of the MOSFET transistor to lower the threshold voltage thus improving the transistor performance.

An embodiment of the instant invention for a SOI logic array circuit is illustrated in FIG. 4. In this embodiment, the input signals 30 are fed directly into the PDN 130 which comprises both NMOS 125 and PMOS 120 transistors. An advantage of the instant invention over previous array logic networks is the elimination of the address predecoder circuit 20 that was illustrated in FIG. 2. Each row 220 of the PDN 130 comprises a parallel connection of NMOS and/or PMOS transistors. In the embodiment shown in FIG. 4, each row 220 is connected to a PUN 50 (i.e. $PUN_1$—$PUN_X$, where X is the number of rows). The outputs of the array logic network 70 ($output_1$—$output_X$) are taken from the common node of the each PUN 50 and row 220 of the PDN 130. NMOS transistors and/or PMOS transistors can be connected to each row 220 of the PDN 130 to provide the required functions. The pull-up networks 50 can comprise depletion mode NMOS transistors, precharge PMOS transistors with a clock input, enhancement mode NMOS transistors, PMOS transistors, or any other suitable device. Each transistor in the PDN 130 is therefore connected to an output line 70 and the circuit ground 60. The input signal lines 30 are connected to the gates of the various NMOS and PMOS transistors that comprise the PDN 130. As defined above, the PDN 130 in the instant invention provides a conditional current path from the array output lines 70 to the circuit ground 60.

An further embodiment of the instant invention for a SOI logic array circuit is illustrated in FIG. 5. Here, the input signals 30 are fed directly into the PDN 115 which comprises both NMOS 110 and PMOS 100 transistors. This embodiment also results in the elimination of the address predecoder circuit 20 that was illustrated in FIG. 2. Each row 65 of the PDN 115 comprises a series connection of NMOS and/or PMOS transistors to provide the required logic function. In the embodiment shown in FIG. 5, each row 65 is connected to a PUN 50 (i.e. $PUN_1$—$PUN_X$, where X is the number of rows). The outputs of the array logic network 70 ($output_1$—$output_X$) are taken from the common node of the each PUN 50 and row 65 of the PDN 115. Each row 65 of the PDN 115 is also connected to a circuit ground 60. The pull-up networks 50 can comprise depletion mode NMOS transistors, precharge PMOS transistors with a clock input, enhancement mode NMOS transistors, PMOS transistors, or any other suitable device. The input signal lines 30 are connected to the gates of the various NMOS and PMOS transistors that comprise the PDN 115. As defined above, the PDN 115 in the instant invention provides a conditional current path from the array output lines 70 to the circuit ground 60.

As stated above, circuit performance of the logic array network of the instant invention can be improved using low threshold voltage techniques such as electrically connecting the transistor gate to the floating body of the SOI transistor. The gate-to-body connection can be applied to the PMOS transistors and NMOS transistors in a PDN. The gate-to-body connection utilizes the body effect of the MOSFET transistor to lower the threshold voltage thus improving the transistor performance. The array logic network circuits described in the instant invention can also be applied to bulk CMOS circuits. Thus the embodiments of the invention illustrated in FIGS. 4 and 5 can be applied to bulk substrates that do not have a buried dielectric layer, i.e., layer 200 in FIG. 3. In the bulk CMOS embodiment of the instant invention, the source/drain diffusions of the PMOS transistor will not abut the source/drain diffusions of the NMOS transistor under currently utilized bulk CMOS transistor isolation schemes. The advantages gained by using the disclosed array logic design over existing bulk CMOS array logic designs will be in the speed and performance of the logic circuits.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiment.

I claim:

1. An array logic circuit on a SOI substrate, comprising:
   a pull-down network comprising a plurality of rows consisting of at least one row of NMOS transistors connected in parallel and at least one row of PMOS transistors connected in parallel wherein each NMOS transistor connected in parallel and each PMOS transistor connected in parallel has a gate terminal;
   a plurality of input address lines connected to the gate terminals of said NMOS and PMOS transistors;
   a plurality of pull-up networks connected to said plurality of rows; and
   a plurality of output lines connected to common nodes of said pull-up networks and said plurality of rows.

2. The array logic circuit of claim 1 wherein said pull-up network comprises a depletion mode NMOS transistor.

3. The array logic circuit of claim 1 wherein said pull-up network comprises a precharge PMOS transistor with a clock input.

4. The array logic circuit of claim 1 wherein at least one of said MOS transistors in said pull-down network has a gate tied to a floating substrate body.

5. An array logic circuit on a SOI substrate, comprising:
   a pull-down network comprising a plurality of rows consisting of at least one row of NMOS transistors connected in series and at least one row of PMOS transistors connected in series wherein each NMOS transistor connected in series and each PMOS transistor connected in series has a gate terminal;
   a plurality of input address lines connected to the gate terminals of said NMOS and PMOS transistors;
   a plurality of pull-up networks connected to said plurality of rows; and
   a plurality of output lines connected to common nodes of said pull-up networks and said plurality of rows.

6. The array logic circuit of claim 5 wherein said pull-up network comprises a depletion mode NMOS transistor.

7. The array logic circuit of claim 5 wherein said pull-up network comprises a precharge PMOS transistor with a clock input.

8. The array logic circuit of claim 5 wherein at least one of said MOS transistors in said pull-down network has a gate tied to a floating substrate body.

9. An array logic circuit, comprising:
   a pull-down network comprising a plurality of rows consisting of at least one row of NMOS transistors connected in parallel and at least one row of PMOS transistors connected in parallel wherein each NMOS transistor connected in parallel and each PMOS transistor connected in parallel has a gate terminal;
   a plurality of input address lines connected to the gate terminals of said NMOS and PMOS transistors;
   a plurality of pull-up networks connected to said plurality of rows; and
   a plurality of output lines connected to common nodes of said pull-up networks and said plurality of rows.

10. The array logic circuit of claim 9 wherein said pull-up network comprises a depletion mode NMOS transistor.

11. The array logic circuit of claim 9 wherein said pull-up network comprises a precharge PMOS transistor with a clock input.

12. An array logic circuit, comprising:
   a pull-down network comprising a plurality of rows consisting of at least one row of NMOS transistors connected in series and at least one row of PMOS transistors connected in series wherein each NMOS transistor connected in series and each PMOS transistor connected in series has a gate terminal;
   a plurality of input address lines connected to the gate terminals of said NMOS and PMOS transistors;
   a plurality of pull-up networks connected to said plurality of rows; and
   a plurality of output lines connected to common nodes of said pull-up networks and said plurality of rows.

13. The array logic circuit of claim 12 wherein said pull-up network comprises a depletion mode NMOS transistor.

14. The array logic circuit of claim 12 wherein said pull-up network comprises a precharge PMOS transistor with a clock input.

* * * * *